(12) United States Patent
Lee et al.

(10) Patent No.: US 9,455,304 B2
(45) Date of Patent: Sep. 27, 2016

(54) ORGANIC LIGHT-EMITTING DIODE DISPLAY WITH WHITE AND BLUE DIODES

(71) Applicant: Apple Inc., Cupertino, CA (US)

(72) Inventors: Jungmin Lee, Cupertino, CA (US); Donghee Nam, Incheon (KR)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/745,014

(22) Filed: Jun. 19, 2015

(65) Prior Publication Data

US 2015/0380470 A1    Dec. 31, 2015

Related U.S. Application Data

(60) Provisional application No. 62/017,490, filed on Jun. 26, 2014.

(51) Int. Cl.
*H01L 27/32* (2006.01)
*H01L 51/50* (2006.01)

(52) U.S. Cl.
CPC ......... *H01L 27/3213* (2013.01); *H01L 27/322* (2013.01); *H01L 51/5044* (2013.01)

(58) Field of Classification Search
CPC .................................................. H01L 27/3213
See application file for complete search history.

(56) References Cited

U.S. PATENT DOCUMENTS

| | | | | |
|---|---|---|---|---|
| 7,531,959 B2* | 5/2009 | Hatwar | ............... | H01L 51/5036 313/505 |
| 7,564,182 B2 | 7/2009 | Boroson et al. | | |
| 7,677,750 B2 | 3/2010 | Jeon et al. | | |
| 7,842,944 B2 | 11/2010 | Choi et al. | | |
| 9,231,034 B1* | 1/2016 | Chen | .................... | H01L 27/3218 |
| 2005/0040756 A1* | 2/2005 | Winters | .............. | H01L 27/3213 313/504 |
| 2006/0188745 A1* | 8/2006 | Liao | .................... | H01L 51/5278 428/690 |
| 2007/0001588 A1* | 1/2007 | Boroson | ............. | H01L 27/3209 313/504 |
| 2007/0228938 A1* | 10/2007 | Hatwar | ............... | H01L 27/3213 313/504 |
| 2008/0268282 A1* | 10/2008 | Spindler | ................ | C09K 11/06 428/690 |
| 2013/0146850 A1* | 6/2013 | Pieh | ..................... | H01L 51/5203 257/40 |
| 2013/0168655 A1 | 7/2013 | Yun et al. | | |

FOREIGN PATENT DOCUMENTS

WO    2005015656    2/2005

* cited by examiner

*Primary Examiner* — Lex Malsawma
(74) *Attorney, Agent, or Firm* — Treyz Law Group, P.C.; G. Victor Treyz (57) ABSTRACT

An organic light-emitting diode display may have an array of pixels with sets of pixels arranged in rows and columns. Each set of pixels includes a red pixel, a green pixel, a blue pixel, and a white pixel. The red pixels each have a white diode and a red color filter element to impart a red color to white light from that white diode. The green pixels each have a white diode and a green color filter element to impart a green color to white light from that white diode. The white pixels each have an unfiltered white diode. The blue pixels each have an unfiltered blue diode. The unfiltered white and blue diodes do not have color filters and emit white and blue light for the white and blue pixels, respectively. The white and blue diodes may be tandem diodes having two or more emissive layers.

21 Claims, 9 Drawing Sheets

ORGANIC LIGHT-EMITTING DIODE DISPLAY WITH WHITE AND BLUE DIODES

This application claims the benefit of provisional patent application No. 62/017,490 filed on Jun. 26, 2014, which is hereby incorporated by reference herein in its entirety.

BACKGROUND

This relates generally to displays, and, more particularly, to organic light-emitting diode displays.

Electronic devices often include displays. Organic light-emitting diode displays may exhibit desirable attributes such as a wide field of view, compact size, and low power consumption. Organic light-emitting diode displays may have individually colored light-emitting diodes such as red, green, and blue diodes or may use an array of white diodes with an overlapping array of red, green, and blue color filter elements. Organic light-emitting diode displays that are based on white diodes may be fabricated using fewer evaporation masks than are generally used when forming a display based on red, green, and blue diodes.

White diodes may be implemented using a tandem design in which a first diode and second diode are arranged in series. The first diode may be a blue diode and the second diode may have a yellow emissive layer or a stack of red and green emissive layers. The light produced by the first and second diodes in each tandem organic light-emitting diode collectively forms white light emissions that can be filtered using an overlapping color filter element. Organic light-emitting diodes with tandem designs may be operated at reduced currents relative to other designs and may therefore exhibit extended lifetimes.

It can be challenging to form a white diode organic light-emitting diode display with a desired color gamut. Color gamut can be enhanced by using narrowband color filter elements, but this adversely affects power efficiency. The reproduction of blue image content can be particularly challenging. White diodes generally contain blue emissive material, but due to the relatively low efficiency available from the blue emissive material, the white diodes associated with blue pixels may need to be driven with relatively large currents. This can reduce the lifetime of a display.

It would therefore be desirable to be able to provide improved organic light-emitting diode displays such as improved organic light-emitting diode displays using an array of white diodes overlapped by a color filter array.

SUMMARY

An organic light-emitting diode display has array of pixels. The array of pixels has sets of pixels arranged in rows and columns. Each set of pixels includes a red pixel, a green pixel, a blue pixel, and a white pixel. The red pixels each have a white diode and a red color filter element that is aligned with the white diode to impart a red color to white light from that white diode. The green pixels each have a white diode and a green color filter element that is aligned with the white diode to impart a green color to white light from that white diode. The white pixels each have an unfiltered white diode. The blue pixels each have an unfiltered blue diode. The unfiltered white and blue diodes do not have color filters and emit white and blue light for the white and blue pixels, respectively. The white and blue diodes may be tandem diodes having two or more emissive layers.

During fabrication, white emissive structures can be deposited through a first mask to form the white diodes for the red, green, and white pixels and blue emissive structures can be deposited through a second mask to form the blue diodes. The blue diodes and the white diodes may share a common blue emissive layer. Each white diode may also have an emissive layer such as a yellow emissive layer or a stack of red and green emissive layers. Each blue diode may contain a portion of the common blue emissive layer and an additional blue emissive layer.

DETAILED DESCRIPTION

Figure 1:
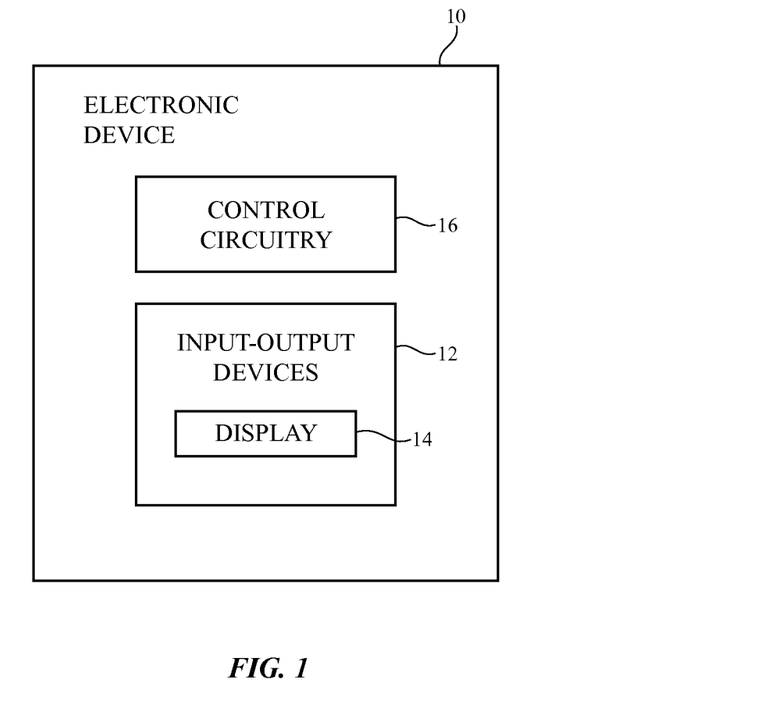
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, non-volatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Figure 2:
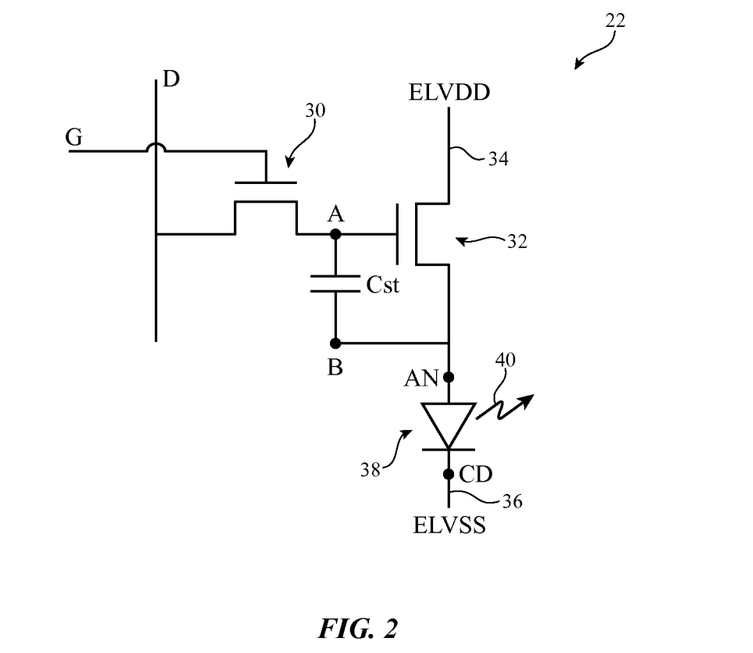
FIG. 2 is a diagram of an illustrative organic light-emitting diode pixel circuit in accordance with an embodiment.

Display 14 may be an organic light-emitting diode display. In an organic light-emitting diode display, each display pixel contains a respective organic light-emitting diode. A schematic diagram of an illustrative pixel circuit for an organic light-emitting diode display pixel is shown in FIG. 2. As shown in FIG. 2, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38. Cathode CD may be shared among multiple diodes (i.e., the cathodes CD of multiple diodes may be tied to a shared voltage). The voltage on the anode of each diode is independently controlled to control the amount of light the diode produces for the pixel associated with that diode.

To ensure that transistor 32 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 30. When switching transistor 30 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 2) may be formed using other configurations (e.g., configurations that include circuitry for compensating for threshold voltage variations in drive transistor 32, etc.). The pixel circuit of FIG. 2 is merely illustrative.

Figure 3:
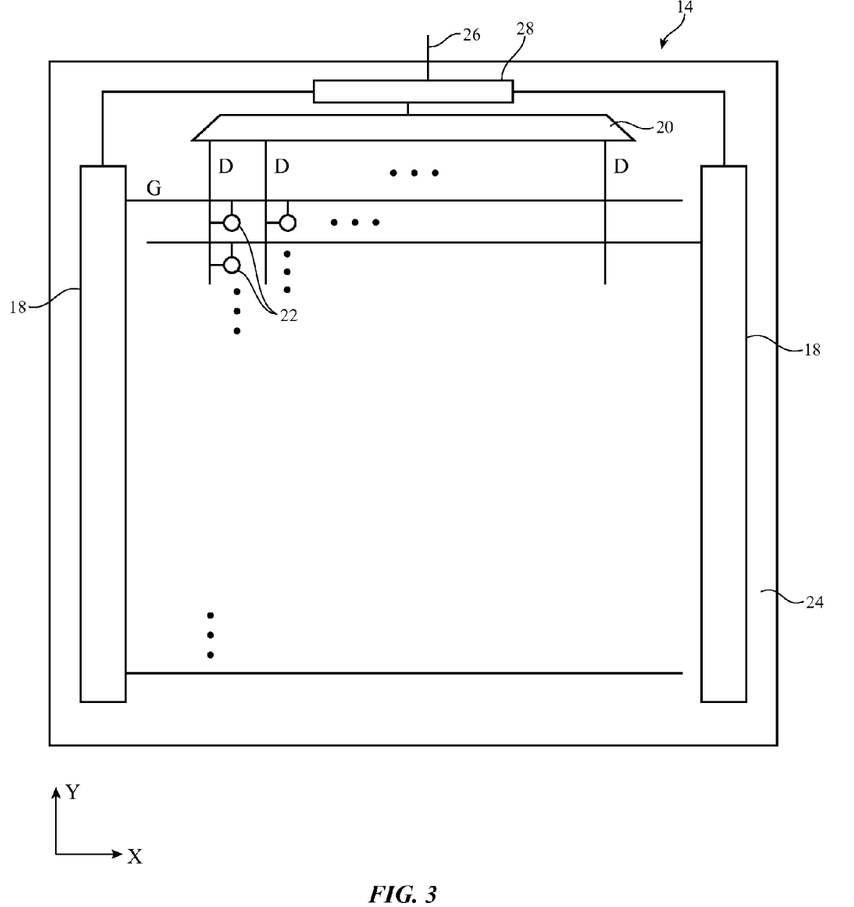
FIG. 3 is a diagram of an illustrative organic light-emitting diode display in accordance with an embodiment.

As shown in FIG. 3, display 14 may include layers such as substrate layer 24. Substrate layers such as layer 24 may be formed from planar rectangular layers of material such as planar glass layers, planar polymer layers, composite films that include polymer and inorganic materials, metallic foils, etc. Substrate 24 may have left and right vertical edges and upper and lower horizontal edges. If desired, substrates such as substrate 24 may have non-rectangular shapes (e.g., shapes with curved edges, etc.).

Display 14 may have an array of pixels 22 for displaying images for a user. Each pixel may have a light-emitting diode such as organic light-emitting diode 38 of FIG. 2 and associated thin-film transistor circuitry (e.g., the pixel circuit of FIG. 2 or other suitable display pixel circuit). Pixels 22 may be arranged in rows and columns. There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, blue pixels that emit blue light, and white pixels that emit white light. Configurations for display 14 that include pixels of other colors may be used, if desired.

Display driver circuitry may be used to control the operation of pixels 22. The display driver circuitry may be formed from integrated circuits, thin-film transistor circuits, or other suitable circuitry. As shown in FIG. 3, display driver integrated circuit 28 may contain communications circuitry for communicating with system control circuitry over path 26. Path 26 may be formed from traces on a flexible printed circuit or other cable. The control circuitry may be located on one or more printed circuits in electronic device 10. During operation, the control circuitry (e.g., control circuitry 16 of FIG. 1) may supply circuitry such as display driver integrated circuit 28 with information on images to be displayed on display 14. Circuits such as display driver integrated circuits may be mounted on substrate 24 or may be coupled to substrate 24 through a flexible printed circuit cable or other paths. The circuitry of display driver integrated circuits such as circuit 28 may also be provided using thin-film transistor circuitry on substrate 24.

To display the images on display pixels 22, display driver circuitry 28 may supply corresponding image data to data lines D while issuing clock signals and other control signals to supporting display driver circuitry such as gate driver circuitry 18 and demultiplexing circuitry 20.

Demultiplexer circuitry 20 may be used to demultiplex data signals from circuit 28 onto a plurality of corresponding data lines D. With the illustrative arrangement of FIG. 3, data lines D run vertically through display 14. Data lines D are associated with respective columns of display pixels 22. Demultiplexer circuitry 20 may be implemented as part of an integrated circuit such as circuit 28 and/or may be formed from thin-film transistor circuitry on substrate 24.

Gate driver circuitry 18 (sometimes referred to as scan line driver circuitry) may be implemented as part of an integrated circuit such as circuit 28 and/or may be implemented using thin-film transistor circuitry on substrate 24. Gate lines G (sometimes referred to as scan lines or horizontal control lines) run horizontally through display 14. Each gate line G is associated with a respective row of display pixels 22. If desired, there may be multiple horizontal control lines such as gate lines G associated with each row of display pixels. Gate driver circuitry 18 may be located on the left side of display 14, on the right side of display 14, or on both the right and left sides of display 14, as shown in FIG. 3.

Gate driver circuitry 18 may assert control signals on the gate lines G in display 14. For example, gate driver circuitry 18 may receive clock signals and other control signals from circuit 28 and may, in response to the received signals, assert a gate signal on gate lines G in sequence, starting with the gate line signal G in the first row of display pixels 22. As each gate line is asserted, data from data lines D is located into the corresponding row of display pixels. In this way, control circuitry such as display driver circuitry 28, 20, and 18 may provide display pixels 22 with signals that direct display pixels 22 to generate light for displaying a desired image on display 14. If desired, more complex control schemes may be used to control display pixels using multiple thin-film transistors (e.g., to implement threshold voltage compensation schemes).

Display circuits such as demultiplexer circuitry 20, gate line driver circuitry 18, and the circuitry of display pixels 22 may be formed using thin-film transistors on substrate 24 such as silicon-based transistors such as polysilicon thin-film transistors, semiconducting-oxide-based transistors such as InGaZnO transistors, or other thin-film transistor circuitry.

Figure 4:
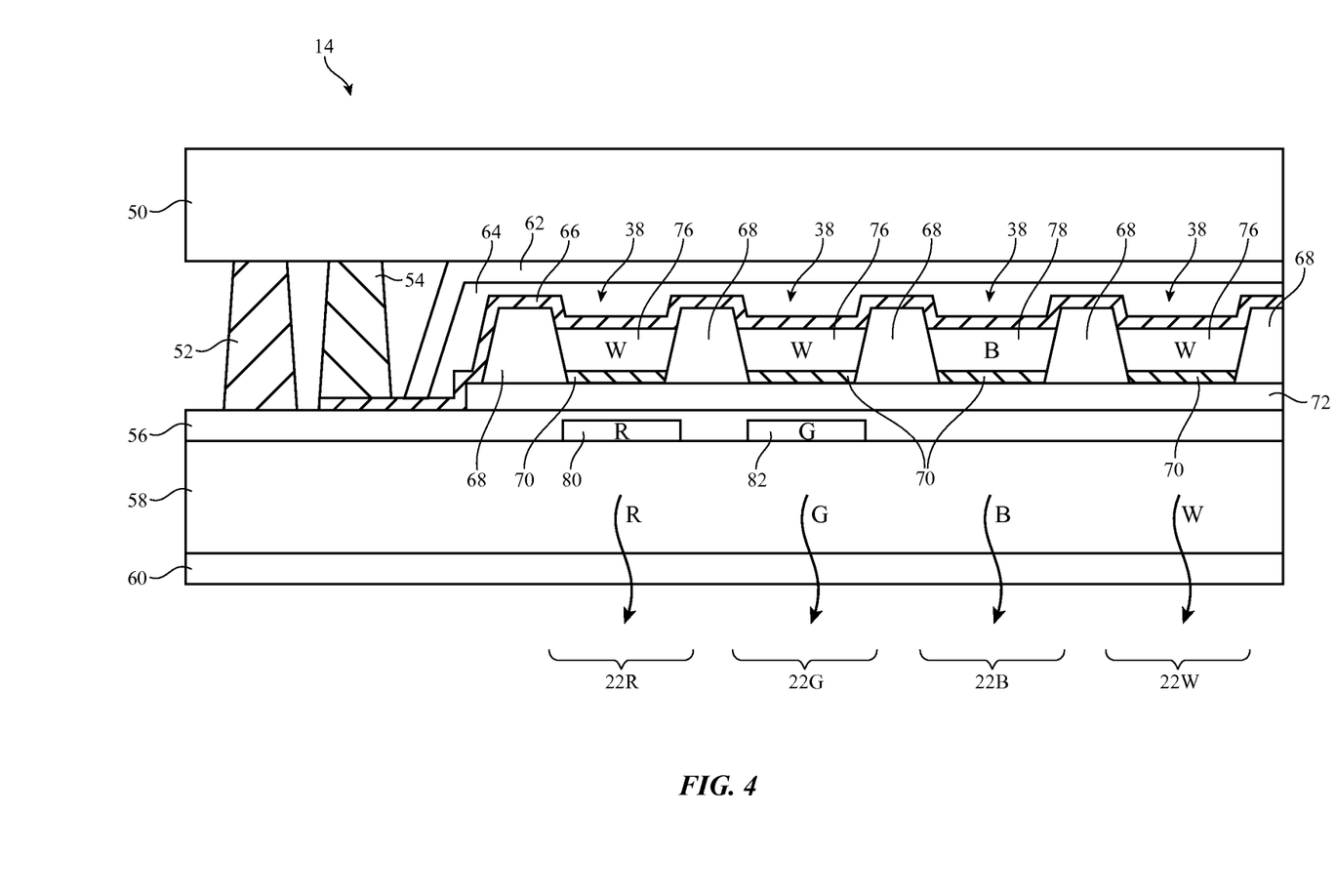
FIG. 4 is a cross-sectional side view of a portion of an illustrative bottom-emission organic light-emitting diode display in accordance with an embodiment.

A cross-sectional side view of a configuration that may be used for the pixels of display 14 of device 10 is shown in FIG. 4. In display 14 of FIG. 4, light is emitted downward. Accordingly, display 14 of FIG. 4 may sometimes be referred to as a bottom emission display. As shown in FIG. 4, display 14 may have a thin-film transistor substrate such as substrate 58. Substrate 58 may be formed from a transparent layer of glass or other clear substrate material. During operation, diodes 38 produce light that is emitted in the downward direction. There are four pixels in FIG. 4: red pixel 22R, green pixel 22G, blue pixel 22B, and white pixel 22W. Pixel 22R emits red light R, pixel 22G emits green light G, pixel 22B emits blue light B, and pixel 22W emits white light W. In display 14, sets of pixels of the type shown in FIG. 4 (i.e., sets of red, green, blue, and white pixels) are arranged in rows and columns, as described in connection with FIG. 3.

A layer of color filter elements such as color filter elements 80 and 82 may be patterned to form an array on the surface of substrate 58. Diodes 38 include white light diodes based on white emissive structures 76. Diodes 38 also include a blue diode based on blue emissive structure 78. The white light diode in pixel 22W emits white light W. No color filters are used to filter white light W (i.e. the white diode in pixel 22W is an unfiltered white diode), so white light W from pixel 22W is emitted through substrate 58. The blue diode in pixel 22B emits blue light B. No color filters are used to filter blue light B (i.e., the blue diode in pixel 22B is an unfiltered blue diode), so blue light B from pixel 22B is emitted through substrate 58. The absence of color filters on the blue and white diodes of pixels 22W and 22B allows these pixels to emit light efficiently.

Red pixel 22R has a white light diode based on white emissive structure 76. A red color filter such as red color filter 80 filters white light from the white diode in red pixel 22R and imparts a red color to the white light, thereby producing red light R. Green pixel 22G also has a white diode based on a white emissive structure 76. A green color filter such as green color filter 82 filters white light from the white diode in green pixel 22G, thereby producing green light G.

Color filter elements 80 and 82 are formed on the inner surface of substrate 58. A planarization layer (e.g., a clear polymer layer or other transparent dielectric layer) such as layer 56 is formed over color filter elements 80 and 82. Thin-film transistors, capacitors, and other thin-film transistor circuitry 72 (e.g., display pixel circuitry such as the illustrative display pixel circuitry of FIG. 2) may be formed on layer 56. An array of transparent anodes 70 may be formed on the surface of thin-film transistor circuitry 72. Transparent anodes may be formed from a transparent conductive material such as indium tin oxide (as an example). Pixel definition layer 68 may be formed from a photoimageable polymer such as black polyimide (as an example). Openings may be formed in pixel definition layer 68. Each pixel definition layer opening receives diode structures for a respective pixel, as shown in FIG. 4.

A blanket cathode layer such as cathode 66 may cover organic emissive layer structures 76 for the white light diodes and organic emissive layer structure 78 for the blue light diode. Cathode 66 may extend over all pixels 22 in display 14. In the bottom-emission configuration of FIG. 4, cathode 66 may be a reflective cathode (sometimes referred to as a mirror cathode) and may be formed from aluminum, other metals, or other reflective conductive structures.

A thin-film encapsulation layer such as layer 64 may cover cathode 66. Thin-film encapsulation layer 64 may be formed from a layer of silicon oxide or other dielectric. Adhesive 62 may be used to attach substrate 50 to the structures on substrate 58. Substrate 50 may be formed from an opaque or transparent layer such as a layer of glass, a layer of plastic, or other materials. Sealant 52 may be used to seal the edges of display 14. Getter structure 54 may help absorb moisture that intrudes into the interior of display 14. Circular polarizer 60 may be used to suppress ambient light reflections from reflective cathode 66. If desired, a black matrix structure (e.g., patterned black masking material aligned with the structures of pixel definition layer 68) may be used in place of circular polarizer to help block off-axis ambient light and thereby reduce ambient light reflections from cathode 66. The use of a circular polarizer may be more effective at reducing ambient light reflections than the use of a black matrix, but the circular polarizer will absorb about 40-60% of the light emitted by diodes 38 and therefore will reduce display efficiency.

Figure 5:
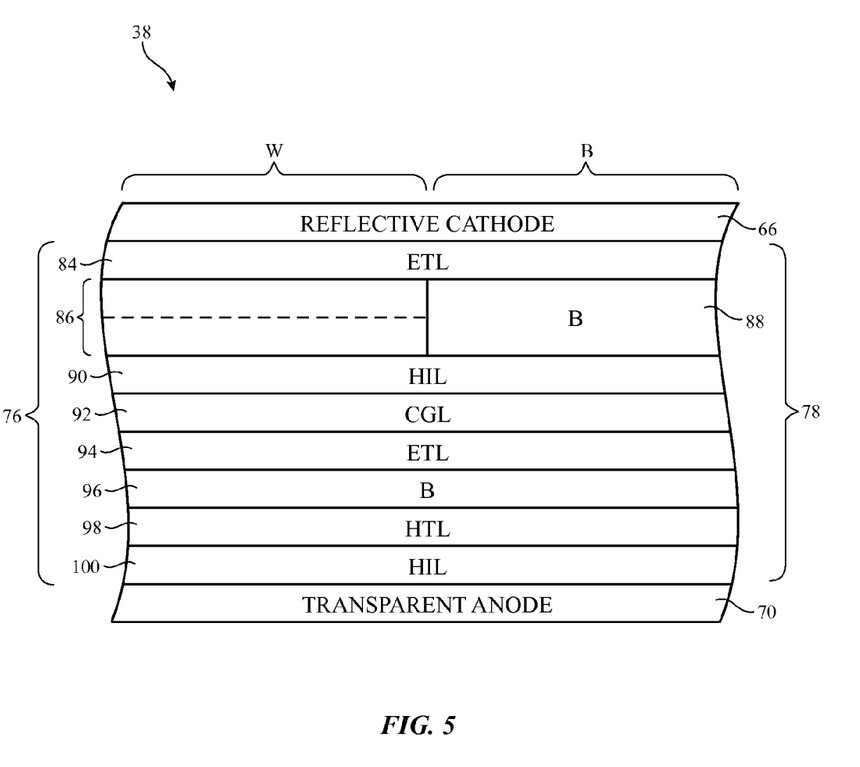
FIG. 5 is a cross-sectional side view of illustrative white and blue diode structures that may be used in the display of FIG. 4 in accordance with an embodiment.

FIG. 5 shows illustrative layers of material of the type that may be used in forming white and blue diodes 38 for bottom-emission display 14 of FIG. 4. As shown in FIG. 5, diodes 38 include a white diode W of the type that may be used for red pixel 22R, green pixel 22G, and white pixel 22W and include a blue diode B of the type that may be used for blue pixel 22B.

The organic light-emitting diodes of display 14 are based on layers of emissive material (e.g., organic electroluminescent material). Diodes 38 may have layers of emissive material of different colors. In white light diodes, emissive layers of different colors may collectively produce white light emissions. In blue diodes, blue emissive layers may be used to produce blue light that can be used in forming blue pixels without using blue color filters.

In blue diode B, blue diode emissive structures 78 are interposed between reflective cathode 66 and transparent anode 70. Structures 78 include first and second blue emissive layers such as blue emissive layer 88 and blue emissive layer 96. Electron transport layer 84 may be interposed between blue emissive layer 88 and reflective cathode 66. Hole injection layer 90, charge generation layer 92, and electron transport layer 94 may be interposed between blue emissive layer 88 and blue emissive layer 96. Hole transport layer 98 and hole injection layer 100 may be interposed between blue emissive layer 96 and transparent anode 70. Because there are two blue emissive layers in blue diode B, blue diode B is made up of two blue diodes coupled in series. Blue diodes such as blue diode B of FIG. 5 may therefore sometimes be referred to as tandem blue diodes. Blue diode B emits blue light for blue pixel 22B. No blue color filter is needed to produce the blue light, so blue light diode B may sometimes be referred to as an unfiltered blue tandem diode.

In white diode W, white emissive structures 76 are interposed between reflective cathode 66 and transparent anode 70. Structures 76 include first emissive layer 86 and second emissive layer 96. Electron transport layer 84 may be interposed between emissive layer 86 and reflective cathode 66. Hole injection layer 90, charge generation layer 92, and electron transport layer 94 may be interposed between emissive layer 86 and emissive layer 96. Hole transport layer 98 and hole injection layer 100 may be interposed between emissive layer 96 and transparent anode 70. Because there are two emissive layers in white diode W, white diode W is made up of two diodes coupled in series and may therefore sometimes be referred to as a tandem white diode. Emissive layer 96 in white diode W may be formed from the same layer of material as emissive layer 96 in blue diode B (i.e., emissive layer 96 may be a common blue emissive layer having a portion in blue diode B and a portion in white diode W). Layer 86 may be a yellow emissive layer or may be a stack of red and green emissive layers. The light produced by the diode formed from emissive layer 86 and the light produced by the diode formed from emissive layer 96 collectively form white light. This white light can be used with no color filter to form white light for pixel 22W, can be passed through a red color filter to form red light for red pixel 22R, or can be passed through a green color filter to form green light for green pixel 22G.

Figure 6:
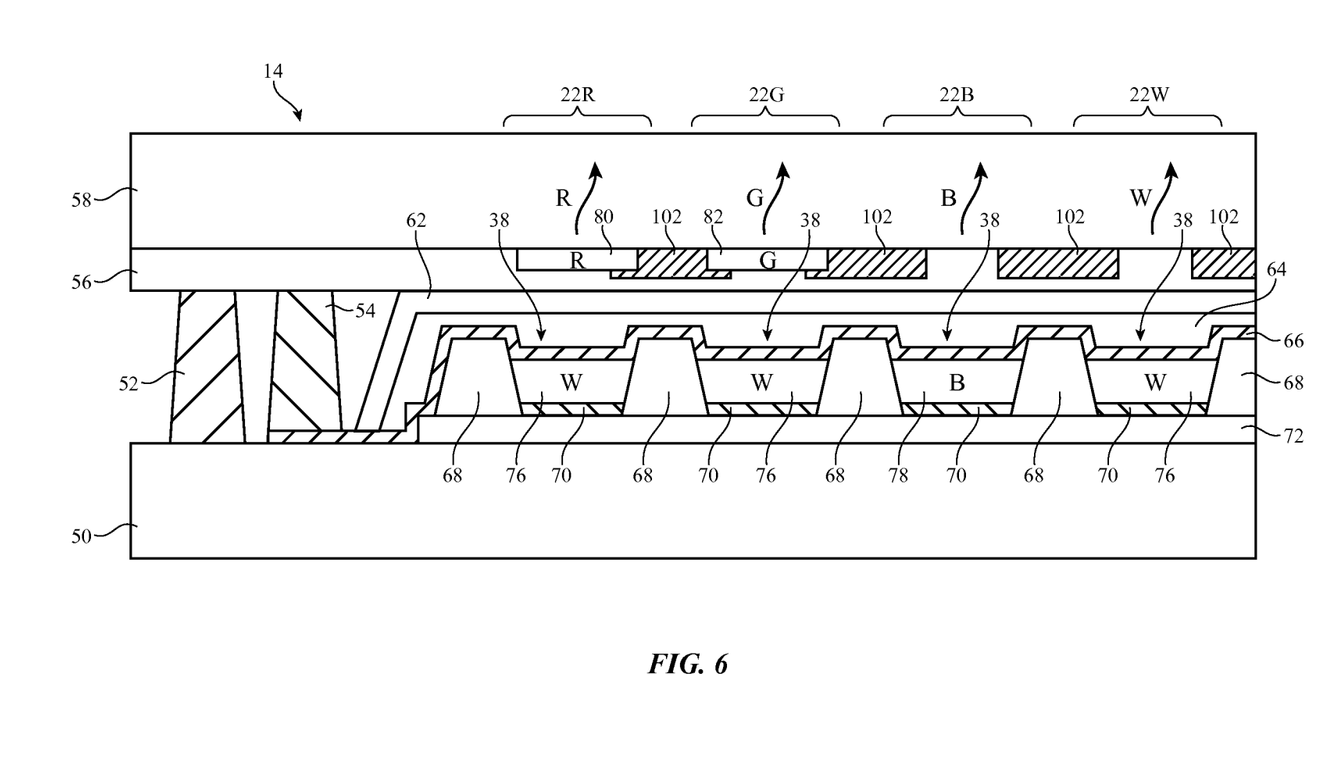
FIG. 6 is a cross-sectional side view of a portion of an illustrative top-emission organic light-emitting diode display in accordance with an embodiment.

FIG. 6 is a cross-sectional side view of display 14 in an illustrative top-emission configuration. As shown in FIG. 6, light from diodes 38 may pass upwards through transparent substrate 58. Substrate 58 may be formed from a transparent layer of glass or other clear substrate material. Display 14 of FIG. 6 has red, green, blue, and white pixels such as red pixel 22R, green pixel 22G, blue pixel 22B, and white pixel 22W. Pixel 22R emits red light R, pixel 22G emits green light G, pixel 22B emits blue light B, and pixel 22W emits white light W. Sets of the red, green, blue, and white pixels of FIG. 6 are arranged in rows and columns, as described in connection with FIG. 3.

Color filter elements 80 and 82 may be patterned in an array on the surface of substrate 58. Diodes 38 include white light diodes based on white emissive structures 76. Diodes 38 also include a blue diode based on blue emissive structure 78. The white light diode in pixel 22W emits white light W. No color filters are used to filter white light W, so white light W from pixel 22W is emitted through substrate 58. The blue diode in pixel 22B emits blue light B. No color filters are used to filter blue light B, so unfiltered blue light B from pixel 22B is emitted through substrate 58. As in the bottom-emission configuration of FIG. 4, the absence of color filters on the blue and white diodes of pixels 22W and 22B of FIG. 6 allows these pixels to emit unfiltered light efficiently.

Red pixel 22R has a white light diode based on white emissive structure 76. A red color filter such as red color filter 80 filters white light from the white diode in red pixel 22R and imparts a red color to the white light, thereby producing red light R. Green pixel 22G also has a white diode based on a white emissive structure 76. A green color filter such as green color filter 82 filters white light from the white diode in green pixel 22G, thereby producing green light G.

The arrangement of FIG. 6 uses a transparent cathode and reflective anodes. Color filter elements 80 and 82 are formed on the inner surface of substrate 58. A planarization layer (e.g., a clear polymer layer or other transparent dielectric layer) such as layer 56 is formed over color filter elements 80 and 82. A black matrix such as black matrix 102 may be formed from a patterned opaque masking layer (e.g., patterned black polymer). Black matrix 102 may help suppress ambient light reflections from reflective the reflective anodes. If desired, a circular polarizer may be incorporated into display 14 to suppress ambient light reflections (e.g., a circular polarizer may be attached to the outer surface of substrate 58 in place of using black matrix 102).

Thin-film transistors, capacitors, and other thin-film transistor circuitry 72 (e.g., display pixel circuitry such as the illustrative display pixel circuitry of FIG. 2) may be formed on substrate layer 50. An array of reflective anodes 70 may be formed on the surface of thin-film transistor circuitry 72. Reflective anodes may be formed from aluminum, other metals, or other reflective conductive material.

Pixel definition layer 68 may be formed from a photoimageable polymer such as black polyimide (as an example). Openings may be formed in pixel definition layer 68. Each pixel definition layer opening receives diode structures for a respective pixel.

A blanket cathode layer such as cathode 66 may cover organic emissive layer structures 76 for the white light diodes and organic emissive layer structure 78 for the blue light diode. Cathode 66 may extend over all pixels 22 in display 14. In the top-emission configuration of FIG. 6, cathode 66 may be a transparent cathode that is formed from layers of conductive material that are sufficiently transparent to allow light from diodes 38 to pass upwards through layer 58. Transparent cathode 66 may, for example, be formed from a thin metal layer (e.g., silver layer, silver and magnesium, etc.), may be formed from silver and indium tin oxide, or may be formed from other materials. A thin-film encapsulation layer such as layer 64 may cover cathode 66. Thin-film encapsulation layer 64 may be formed from a layer of silicon oxide or other dielectric. Planarization layer 56 may cover color filter elements 80 and 82 and black matrix 102. Planarization layer 56 may be formed from a transparent material such as a layer of clear polymer. Transparent adhesive 62 (e.g., a clear polymer) may be used to attach substrate 58 to the structures on substrate 50 and may help match the index of refraction of layer 56 to the index of refraction of layer 64 and the other structures on substrate 50. Substrate 50 may be formed from an opaque or transparent layer such as a layer of glass, a layer of plastic, or other materials. Sealant 52 may be used to seal the edges of display 14. Getter structure 54 may help absorb moisture that intrudes into the interior of display 14.

Figure 7:
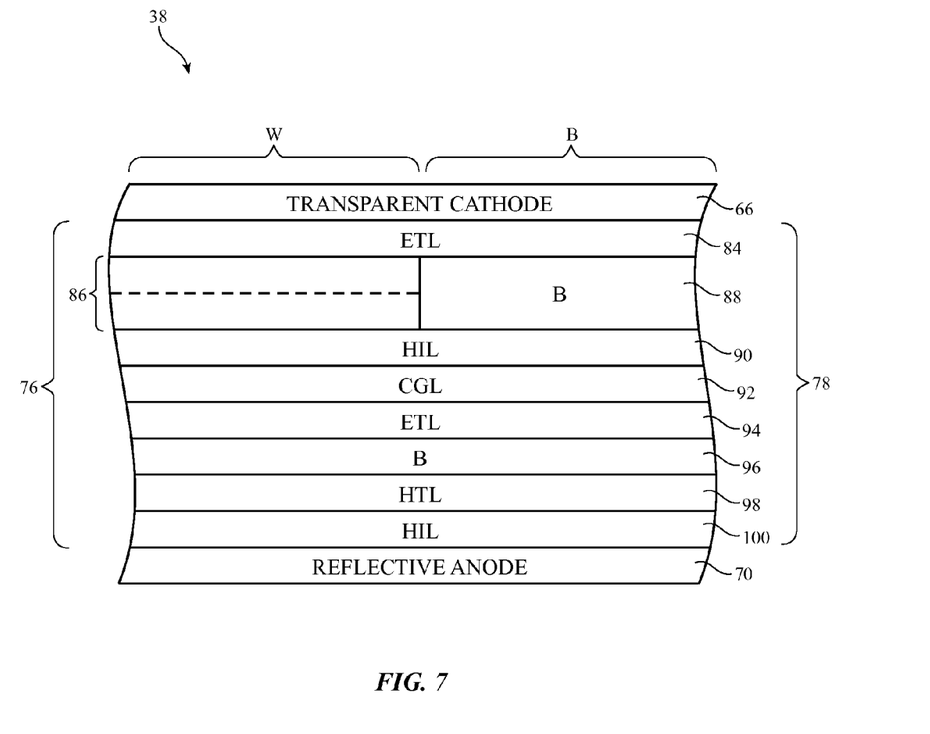
FIG. 7 is a cross-sectional side view of illustrative white and blue diode structures that may be used in the display of FIG. 6 in accordance with an embodiment.

FIG. 7 shows illustrative layers of material that may be used to form diodes 38 for top-emission display 14 of FIG. 6. As shown in FIG. 7, diodes 38 include a white diode W of the type that may be used for red pixel 22R, green pixel 22G, and white pixel 22W and include a blue diode B of the type that may be used for blue pixel 22B.

In blue diode B, blue emissive structures 78 are interposed between transparent cathode 66 and reflective anode 70. Structures 78 include first and second blue emissive layers such as blue emissive layer 88 and blue emissive layer 96. Electron transport layer 84 may be interposed between blue emissive layer 88 and transparent cathode 66. Hole injection layer 90, charge generation layer 92, and electron transport layer 94 may be interposed between blue emissive layer 88 and blue emissive layer 96. Hole transport layer 98 and hole injection layer 100 may be interposed between blue emissive layer 96 and reflective anode 70. Because there are two blue emissive layers (and therefore two blue diodes) in blue diode B, blue diode B is a tandem blue diode. Blue diode B emits unfiltered blue light for blue pixel 22B without using a color filter and may therefore sometimes be referred to as an unfiltered blue diode.

In white diode W, which also uses a tandem diode configuration, white emissive structures 76 are interposed between transparent cathode 66 and reflective anode 70. Structures 76 include first emissive layer 86 and second emissive layer 96. Electron transport layer 84 may be interposed between emissive layer 86 and transparent cathode 66. Hole injection layer 90, charge generation layer 92, and electron transport layer 94 may be interposed between emissive layer 86 and emissive layer 96. Hole transport layer 98 and hole injection layer 100 may be interposed between emissive layer 96 and reflective anode 70. Because there are two emissive layers in white diode W, white diode W is made up of two diodes coupled in series and may be referred to as a tandem white diode. Emissive layer 96 may be a blue emissive layer (i.e., a common layer shared with the lower blue emissive material in blue diode B). Layer 86 may be a yellow emissive layer or may be formed from a stack of red and green emissive layers. The light produced by the diode formed from emissive layer 86 and the light produced by the diode formed from emissive layer 96 collectively form white light. This white light can be used with no color filter to form white light for pixel 22W, can be passed through a red color filter to form red light for red pixel 22R, or can be passed through a green color filter to form green light for green pixel 22G.

If desired, more than two diodes may be used in each pixel (i.e., three or more diodes may be coupled in series to form within each pixel rather than two diodes). An illustrative three-diode tandem diode configuration that may be used for white and blue diodes 38 is shown in FIG. 8.

Figure 8:
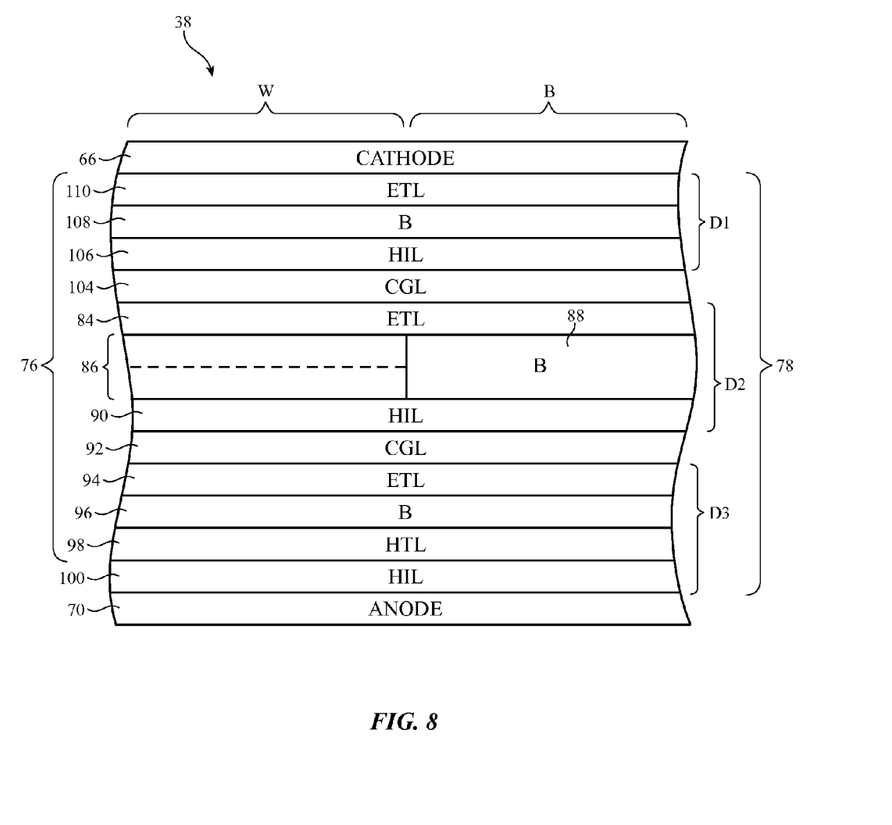
FIG. 8 is a cross-sectional side view of illustrative three-element white and blue diode structures that may be used in displays of the type shown in FIGS. 4 and 6 in accordance with an embodiment.

As shown in FIG. 8, diodes 38 include a tandem white diode W of the type that may be used for red pixel 22R, green pixel 22G, and white pixel 22W and include a tandem blue diode B of the type that may be used for blue pixel 22B. The structures of FIG. 8 may be used in a top-emission display or a bottom-emission display. In a top-emission display, cathode 66 is transparent and anodes 70 are reflective. In a bottom-emission display, cathode 66 is reflective and anodes 70 are transparent.

Both the white and blue diodes of FIG. 8 include diode structures associated with three Diodes—diode D1, diode D2, and diode D3. In blue diode B of FIG. 8, blue emissive structures 78 are interposed between cathode 66 and anode 70. Structures 78 include first, second, and third blue emissive layers such as blue emissive layer 88, blue emissive layer 96, and blue emissive layer 108. Electron transport layer 110 may be interposed between cathode 66 and blue emissive layer 108. Hole injection layer 106, charge generation layer 104, and electron transport layer 84 may be coupled between blue emissive layer 108 and blue emissive layer 88. Hole injection layer 90, charge generation layer 92, and electron transport layer 94 may be interposed between blue emissive layer 88 and blue emissive layer 96. Hole transport layer 98 and hole injection layer 100 may be interposed between blue emissive layer 96 and reflective anode 70. Blue diode B emits blue light for blue pixel 22B. Because there are three diodes D1, D2, and D3 in blue diode B, the current through each diode is reduced and blue diode lifetime may be extended.

In white diode W, which also uses a tandem diode configuration, white emissive structures 76 are interposed between cathode 66 and anode 70. Structures 76 include emissive layer 86, emissive layer 96, and emissive layer 108. Electron transport layer 110 may be interposed between cathode 66 and blue emissive layer 108. Hole injection layer 106, charge generation layer 104, and electron transport layer 84 may be interposed between blue emissive layer 108 and emissive layer 86. Hole injection layer 90, charge generation layer 92, and electron transport layer 94 may be interposed between emissive layer 86 and emissive layer 96. Hole transport layer 98 and hole injection layer 100 may be interposed between emissive layer 96 and anode 70. Because there are three emissive layers in white diode W, white diode W is made up of three diodes coupled in series. Emissive layer 96 may be a blue emissive layer. Emissive layer 108 may also be a blue emissive layer. Layer 86 may be a yellow emissive layer or may be formed from a stack of red and green emissive layers. The light produced by the diode formed from emissive layer 86 and the light produced by the diodes formed from emissive layers 96 and 108 collectively form white light. This white light can be used with no color filter to form white light for pixel 22W, can be passed through a red color filter to form red light for red pixel 22R, or can be passed through a green color filter to form green light for green pixel 22G.

Figure 9:
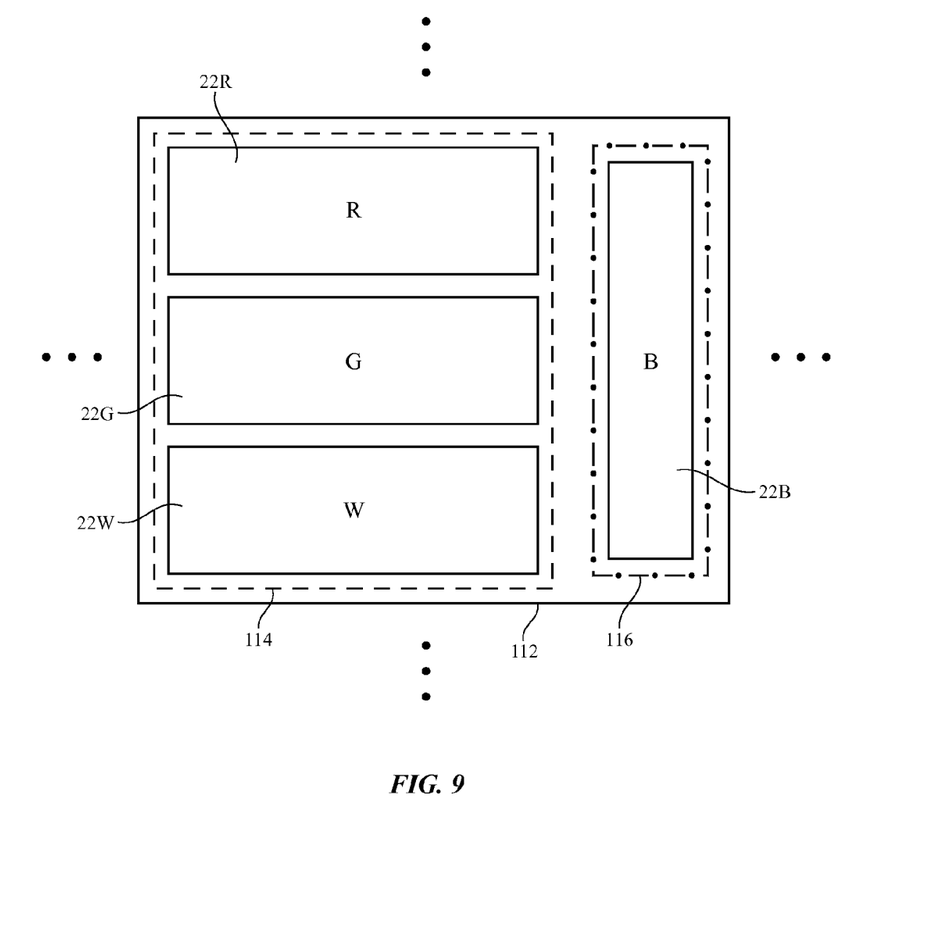
FIG. 9 is a top view of a set of red, green, white, and blue pixels showing how a first mask may be used when depositing white diode emissive structures for the red, green, and white pixels and how a second mask may be used when depositing blue diode emissive structures for the blue pixels.

FIG. 9 is a diagram of an illustrative layout that may be used for each set of four pixels (22R, 22G, 22W, and 22B) in display 14. The pattern of FIG. 9 may be tiled across the surface of display 14 so that the sets of pixels are arranged in rows and columns. During fabrication, white diode structures (e.g., a yellow emissive layer or a stack formed from red and green emissive layers) may be evaporated through a mask with openings such as opening 114, thereby forming the emissive layer structures needed for the white diodes associated with pixels 22R, 22G, and 22G. Blue emissive structures that are specific to the blue diodes of pixels 22B may be evaporated through a mask with openings such as opening 116. Layers of emissive material and other diode structures that are common to both white and blue diodes may be deposited as blanket films. Because a small number of masks are used in forming display 14, processing operations are simplified.

The foregoing is merely illustrative and various modifications can be made by those skilled in the art without departing from the scope and spirit of the described embodiments. The foregoing embodiments may be implemented individually or in any combination.

What is claimed is:

1. An organic light-emitting diode display, comprising:
   white pixels each having an unfiltered tandem white diode;
   blue pixels each having an unfiltered tandem blue diode;
   red pixels each having a tandem white diode that produces white light and a red color filter element that imparts a red color to that white light; and
   green pixels each having a tandem white diode that produces white light and a green color filter element that imparts a green color to that white light.

2. The organic light-emitting diode display defined in claim 1 wherein unfiltered tandem white diode of the white pixels and the tandem white diodes of the red and green pixels are formed from commonly deposited white emissive structures.

3. The organic light-emitting diode display defined in claim 2 wherein the white emissive structures include a blue emissive layer and a yellow emissive layer.

4. The organic light-emitting diode display defined in claim 3 wherein the tandem blue diode contains a blue emissive layer and wherein the blue emissive layer of the white emissive structures and the blue emissive layer of the tandem blue diode are formed from a common layer of material.

5. The organic light-emitting diode display defined in claim 4 wherein the tandem blue diode and the unfiltered tandem white diode have reflective anodes and a transparent cathode.

6. The organic light-emitting diode display defined in claim 4 wherein the tandem blue diode and the unfiltered tandem white diode have a reflective cathode and transparent anodes.

7. The organic light-emitting diode display defined in claim 2 wherein the white emissive structures include a blue emissive layer and an emissive layer formed from a stack of red and green emissive layers.

8. The organic light-emitting diode display defined in claim 7 wherein the tandem blue diode contains a blue emissive layer and wherein the blue emissive layer of the white emissive structures and the blue emissive layer of the tandem blue diode are formed from a common layer of material.

9. The organic light-emitting diode display defined in claim 8 wherein the tandem blue diode and the unfiltered tandem white diode have reflective anodes and a transparent cathode.

10. The organic light-emitting diode display defined in claim 8 wherein the tandem blue diode and the unfiltered tandem white diode have a reflective cathode and transparent anodes.

11. The organic light-emitting diode display defined in claim 8 wherein the tandem blue diode has three blue emissive layers.

12. The organic light-emitting diode display defined in claim 11 wherein the unfiltered tandem white diode comprises two blue emissive layers.

13. The organic light-emitting diode display defined in claim 12 wherein the unfiltered tandem white diode further comprises an emissive layer selected from the group consisting of: a yellow emissive layer and a stack of red and green emissive layers.

14. An organic light-emitting diode display, comprising:
an array of pixels having sets of pixels arranged in rows and columns, each set of pixels including a white pixel, a blue pixel, a red pixel, and a green pixel;
a blue tandem diode in each blue pixel; and
white tandem diodes respectively in the white pixel, the red pixel, and the green pixel.

15. The organic light-emitting diode display defined in claim 14 wherein the white tandem diodes each have a blue emissive layer and an emissive layer selected from the group consisting of: a yellow emissive layer and a stack of red and green emissive layers and wherein the blue tandem diodes each have two blue emissive layers one of which is common with the blue emissive layer of the white tandem diodes.

16. The organic light-emitting diode display defined in claim 15 further comprising a circular polarizer.

17. The organic light-emitting diode display defined in claim 15 further comprising a black matrix having openings aligned with the array of pixels to suppress ambient light reflections.

18. An organic light-emitting diode display, comprising:
a plurality of sets of pixels, each set of pixels include a white pixel, a blue pixel, a red pixel, and a green pixel;
a blue tandem diode in each blue pixel; and
white diodes respectively in the white pixel, the red pixel, and the green pixel; and
a layer of color filter elements aligned with the pixels, wherein the layer of color filter elements includes red color filter elements and green color filter elements and is free of blue color elements.

19. The organic light-emitting diode display defined in claim 18 wherein each red color filter element is aligned with a respective one of the white diodes to produce red light for a corresponding one of the red pixels and wherein each green color filter element is aligned with a respective one of the white diodes to produce green light for a corresponding one of the green pixels.

20. The organic light-emitting diode display defined in claim 19 further comprising first and second blue emissive layers, wherein each blue tandem diode contains a respective portion of the first blue emissive layer and a respective portion of the second blue emissive layer and wherein each white diode contains a respective portion of the first blue emissive layer.

21. The organic light-emitting diode display defined in claim 20 further comprising a third blue emissive layer, wherein each blue tandem diode contains a respective portion of the third blue emissive layer.

* * * * *